(12) United States Patent
Hirscher et al.

(10) Patent No.: US 7,094,507 B2
(45) Date of Patent: Aug. 22, 2006

(54) METHOD FOR DETERMINING AN OPTIMAL ABSORBER STACK GEOMETRY OF A LITHOGRAPHIC REFLECTION MASK

(75) Inventors: Stefan Hirscher, Waldburg (DE); Frank-Michael Kamm, Dresden (DE)

(73) Assignee: Infineon Technologies AG, Munich (DE)

( * ) Notice: Subject to any disclaimer, the term of this patent is extended or adjusted under 35 U.S.C. 154(b) by 81 days.

(21) Appl. No.: 10/976,159

(22) Filed: Oct. 29, 2004

(65) Prior Publication Data

US 2006/0095208 A1   May 4, 2006

(51) Int. Cl.
G03F 1/14 (2006.01)
G03F 9/00 (2006.01)

(52) U.S. Cl. ............... 430/5; 702/1; 716/19
(58) Field of Classification Search ........... 702/1–18; 430/5; 716/19; 174/253; 356/508–509; 355/67; 250/492.2
See application file for complete search history.

(56) References Cited

U.S. PATENT DOCUMENTS

| | | | |
|---|---|---|---|
| 5,045,417 A * | 9/1991 | Okamoto | 430/5 |
| 5,190,836 A * | 3/1993 | Nakagawa et al. | 430/5 |
| 5,399,448 A * | 3/1995 | Nagata et al. | 430/5 |
| 6,635,391 B1 * | 10/2003 | Stearns et al. | 430/5 |
| 6,773,854 B1 * | 8/2004 | Ehrmann et al. | 430/5 |
| 6,835,508 B1 * | 12/2004 | Butschke et al. | 430/5 |
| 6,841,786 B1 * | 1/2005 | Kamm | 250/492.2 |

FOREIGN PATENT DOCUMENTS

DE    101 23 768 A1    12/2002

* cited by examiner

*Primary Examiner*—John Barlow
*Assistant Examiner*—Victor J. Taylor
(74) *Attorney, Agent, or Firm*—Morrison & Foerster LLP

(57) ABSTRACT

The present invention relates to a method for determining an optimal absorber stack geometry of a lithographic reflection mask comprising a reflection layer and a patterned absorber stack provided on the reflection layer, the absorber stack having a buffer layer and an absorber layer. The method is based on simulating aerial images for different absorber stack geometries in order to determine process windows corresponding to the absorber stack geometries. The optimal absorber stack geometry is identified by the maximum process window size. The invention further relates to a method for fabricating a lithographic reflection mask and to a lithographic reflection mask.

7 Claims, 6 Drawing Sheets

METHOD FOR DETERMINING AN OPTIMAL ABSORBER STACK GEOMETRY OF A LITHOGRAPHIC REFLECTION MASK

TECHNICAL FIELD OF THE INVENTION

The present invention relates to a method for determining an optimal absorber stack geometry of a lithographic reflection mask and to a method for fabricating a lithographic reflection mask and to a lithographic reflection mask.

BACKGROUND OF THE INVENTION

The fabrication of highly integrated electrical circuits with small structural dimensions requires special structuring procedures. One of the most common procedures is the so-called lithographic structuring method. This method comprises applying a thin layer of a radiation-sensitive photoresist on the surface of a semiconductor substrate disc, also referred to as wafer, and exposing the same by radiation transmitted through a lithographic mask. In the so-called photolithography, electromagnetic radiation is used. During the exposing step, a lithographic structure located on the mask is imaged on the photoresist layer by means of an exposure tool including the mask. Thereafter, the target structure is transferred into the photoresist layer and subsequently into the surface of the wafer by performing development and etch processes.

One main demand of the semiconductor industry is the continuous power enhancement provided by increasingly faster integrated circuits which is interrelated to a miniaturization of the electronic structures. Thereby, the attainable resolution of the structures is generally limited by the wavelength of the applied radiation. In the course of this development, lithographic methods are performed with radiation having ever smaller wavelengths. At present, the smallest exposure wavelength used in the semiconductor production is 193 nm which enables the fabrication of minimal feature sizes of approximately 70 nm. For the nearer future, the application of the so-called 193 nm immersion lithography is intended, thus allowing minimal feature sizes of about 50 nm.

In order to achieve still smaller feature sizes, the so-called extreme ultraviolet lithography (EUVL) is being developed which is based on the application of electromagnetic radiation in the extreme ultraviolet (EUV) region with a wavelength of 13.4 nm. According to plans of the semiconductor industry, the EUV-lithography is considered to be used for the fabrication of dense sub-40 nm and isolated sub-25 nm structures by the end of this decade.

Since no refractive materials (lenses) exist for EUV radiation, the radiation has to be reflected by special mirrors, i.e. multilayer reflection elements, which are used in the corresponding exposure systems for the exposure tools and for the lithographic masks. A typical EUVL reflection mask comprises a carrier substrate, a multilayer reflection layer provided on the carrier substrate, and a patterned absorber stack provided on the multilayer reflection layer which defines the lithographic structure. The reflection layer usually consists of a number of Si/Mo-bilayers, which are disposed upon each other. The patterned absorber stack typically comprises a buffer layer consisting for example of $SiO_2$ and an absorber layer consisting for example of Cr or TaN. The buffer layer of the absorber stack serves for protection of the multilayer reflection layer during the fabrication of the reflection mask, in particular regarding repair processes of pattern defects.

In order to provide a high contrast of the so-called aerial image, i.e. the intensity distribution of the radiation imaged on a wafer, the absorber stack of a conventional EUVL reflection mask in general has a thickness which is relatively large compared to the wavelength of the radiation, and thus comprises a geometry with a high aspect ratio, i.e. a high ratio between the thickness and a lateral dimension. A high aspect ratio geometry of an absorber stack provokes some disadvantages, however. Since a lithographic reflection mask is irradiated in an oblique angle of approximately 60 relative to a vertical plane, shadowing effects generally occur. Due to an absorber stack with a high aspect ratio, these shadowing effects strongly affect the imaging quality of a lithographic process. In particular, structure displacements and alterations of lateral dimensions of the structures, also referred to as critical dimension (CD), occur.

Another consequence of a high aspect ratio geometry of an absorber stack is a reduction of the lithography process window, i.e. the range of possible defocus and intensity dose values corresponding to a tolerable range of target critical dimension values. In general, focus and intensity dose settings of an exposure tool are not constant in a lithographic process but comprise variations, e.g. due to a wafer's non-flatness or due to fluctuations caused by the exposure tool. Due to such variations, a target critical dimension lies within a defined rage. A reduction of the process window increases the danger of rejections of processed wafers having structures with intolerable critical dimension values.

In order to solve these problems, different solution concepts have been proposed. One concept is based on providing reflection masks having structured multilayer reflection layers instead of patterned absorber stacks in order to avoid shadowing effects, as e.g. described in DE 101 23 768 A1. However, the application of such reflection masks having patterned reflection layers requires the additional development of defect inspection and repair methods. But in the case of dark defects, i.e. an area where too many reflective multilayers have been removed, repairing is practically impossible. Moreover, structured multilayer reflection layers have a lower stability in particular concerning cleaning procedures.

Other concepts include methods for determining improved absorber stack layouts by performing optical or aerial image simulations in which structure elements of absorber stacks are laterally displaced in an iterative manner in order to compensate for or minimize the displacements of the target structures due to shadowing effects. Such methods, however, which are alike to optical proximity correction techniques (OPC) performed on standard transmittance masks, are very complex and time-consuming.

SUMMARY OF THE INVENTION

The present invention provides an improved method for determining an optimal absorber stack geometry of a lithographic reflection mask.

The present invention also provides a lithographic reflection mask having an optimal absorber stack that overcomes or diminishes the above-mentioned disadvantages of the prior art reflection masks having absorber stacks with a high aspect ratio.

The present invention also provides a method for fabricating a lithographic reflection mask having an optimal absorber stack.

According to one embodiment of the present invention, there is a method for determining an optimal absorber stack geometry of a lithographic reflection mask comprising a reflection layer and a patterned absorber stack provided on the reflection layer is provided, wherein the absorber stack has a buffer layer and an absorber layer. In a first step, a target pattern for a structure imaged on a substrate by means of an exposure tool including the lithographic reflection mask to reflect a radiation is defined. This target pattern comprises a critical dimension range of target critical dimension values.

Afterwards, an absorber stack geometry for the target pattern is defined. This step includes defining a value of at least one absorber stack parameter, wherein the absorber stack parameter includes a buffer thickness, a buffer sidewall angle, an absorber thickness, an absorber sidewall angle and a lateral absorber stack dimension.

Subsequently, aerial images of the structure imaged on the substrate are simulated for a predetermined range of defocus values. This range of defocus values represents e.g. typical focus failures caused by an exposure tool used in a lithographic process.

In a subsequent step, each aerial image is evaluated by applying a predetermined range of intensity threshold values to determine corresponding critical dimension values of the structure imaged on the substrate. By applying a predetermined range of intensity threshold values, e.g. typical intensity dose variations of an exposure tool or other process variations like developer concentration variations which are equivalent to intensity dose variations are incorporated into the simulation.

Afterwards, the obtained critical dimension values of the structure imaged on the substrate are compared to the critical dimension range of target critical dimension values of the target pattern to determine a process window. Thereby, the size of the process window is defined by defocus and intensity threshold values corresponding to target critical dimension values.

Subsequently, further absorber stack geometries for the target pattern are defined by varying the value of the absorber stack parameter. After that, the described steps of simulating aerial images, evaluating each aerial image and comparing the obtained critical dimension values are repeated for the further absorber stack geometries to determine further process windows.

Thereafter, the sizes of the determined process windows corresponding to the defined absorber stack geometries are compared to determine the optimal absorber stack geometry. Thereby, the optimal absorber stack geometry is identified by the maximum process window size.

This method allows for determining an optimal absorber stack geometry of a lithographic reflection mask in an accurate and reliable manner. In contrast to the above-described OPC-alike simulation methods, the inventive method mainly focuses on varying only "vertical" parameters of an absorber stack geometry such as the thicknesses and the sidewall angles of the absorber layer and of the buffer layer. As a consequence, the inventive method is more time-efficient.

Moreover, the inventive method deals with determining an optimal absorber stack geometry in relation to a process window having a maximum size. As a consequence, an absorber stack geometry of a lithographic reflection mask can be determined which provides stable lithographic process conditions despite unwanted and perturbing defocus settings and intensity dose variations.

The inventive method is particularly suited for determining an optimal absorber stack having a reduced thickness compared to that of the above-described conventional reflection masks having absorber stacks with a high aspect ratio geometry. Consequently, the inventive method contributes to determining an absorber stack geometry of a lithographic reflection mask having reduced shadowing effects. In this manner, the imaging quality of a lithographic process can be further enhanced.

In a preferred embodiment of the present invention, a range of values of the absorber stack parameter used in the simulation steps is defined on the basis of intensity contrast values of simulated aerial images.

These aerial images are simulated in advance according to the simulation steps described above and are analyzed with regard to the intensity contrast i.e. the difference between the minimum and the maximum intensity values of an aerial image. Thereafter, values of the absorber stack parameter and thus absorber stack geometries corresponding to sufficiently high contrast values of these aerial images are predefined. Consequently, an optimal absorber stack geometry of a lithographic reflection mask can be determined which provides high contrasts of aerial images in a lithographic process. In addition, the method for determining an optimal absorber stack geometry is sped up due to the pre-determination of values of the absorber stack parameter. Moreover, it is preferred to specifically predetermine low values of the buffer layer and/or of the absorber layer thickness. In this manner, the resulting determined optimal absorber stack has a low thickness, so that shadowing effects are reduced.

In another alternative embodiment of the present invention, a range of values of the absorber stack parameter used in the simulation steps is defined on the basis of intensity contrast values of simulated near-fields of the radiation reflected on the lithographic reflection mask.

In contrast to aerial images, optical near-fields only incorporate the reflection performance of the lithographic reflection mask and neglect the optical properties of the exposure tool. As a consequence, the predetermination of values of the absorber stack parameter can be sped up and can in particular be carried out independently from the properties of an exposure tool. Thereby it is preferred to predefine values of the absorber stack parameter corresponding to sufficiently high contrast values of the near-fields. In particular it is additionally preferred to predefined low values of the buffer layer and/or of the absorber, layer thickness.

According to another embodiment of the present invention, there is a method for fabricating a lithographic reflection mask comprising a reflection layer and a patterned absorber stack provided on the reflection layer is provided, wherein the absorber stack has a buffer layer and an absorber layer. In a first step, an optimal absorber stack geometry of the lithographic reflection mask is determined by performing the inventive method or one of the preferred embodiments of the method described above. Subsequently, a carrier substrate with a reflection layer and an absorber blank provided on the reflection layer is provided. The absorber blank comprises an unpatterned buffer layer and an unpatterned absorber layer, wherein the thicknesses of the buffer layer and of the absorber layer are defined according to the determined optimal absorber stack geometry. Thereafter, the absorber blank is structured according to the target pattern to provide a patterned absorber stack on the reflection layer, wherein sidewalls of the buffer layer and of the absorber layer are provided with sidewall angles according to the determined optimal absorber stack geometry.

This method allows for fabricating a lithographic reflection mask having an optimal absorber stack, thus allowing an improved imaging quality in a lithographic process. The method is in particular suited for the fabrication of a lithographic reflection mask comprising an absorber stack with a reduced thickness. As described above, such a reflection mask is characterized by reduced shadowing effects, therefore providing a further enhanced imaging quality in a lithographic process.

According to another embodiment of the present invention, a lithographic reflection mask is provided. This lithographic reflection mask comprises a carrier substrate, a reflection layer provided on the carrier substrate and a patterned absorber stack provided on the reflection layer. The absorber stack comprises a buffer layer and an absorber layer, wherein sidewalls of the absorber layer have a sidewall angle of at least ten degrees relative to a vertical plane. Such a lithographic reflection mask provides a good imaging quality in a lithographic process since shadowing effects are reduced. This particularly applies to a small thickness of the absorber stack.

In a preferred embodiment of the present invention, sidewalls of the absorber layer have a sidewall angle of at least twenty degrees relative to a vertical plane in order to further reduce shadowing effects and therefore enhance the imaging quality.

A comparable effect on the imaging quality is provided in yet another preferred embodiment of the present invention, wherein sidewalls of the buffer layer have a sidewall angle of more than zero degrees relative to a vertical plane.

BRIEF DESCRIPTION OF THE DRAWINGS

The invention is described in more detail below with reference to the drawings and exemplary embodiments, in which.

DETAILED DESCRIPTION OF THE INVENTION

Figure 1:
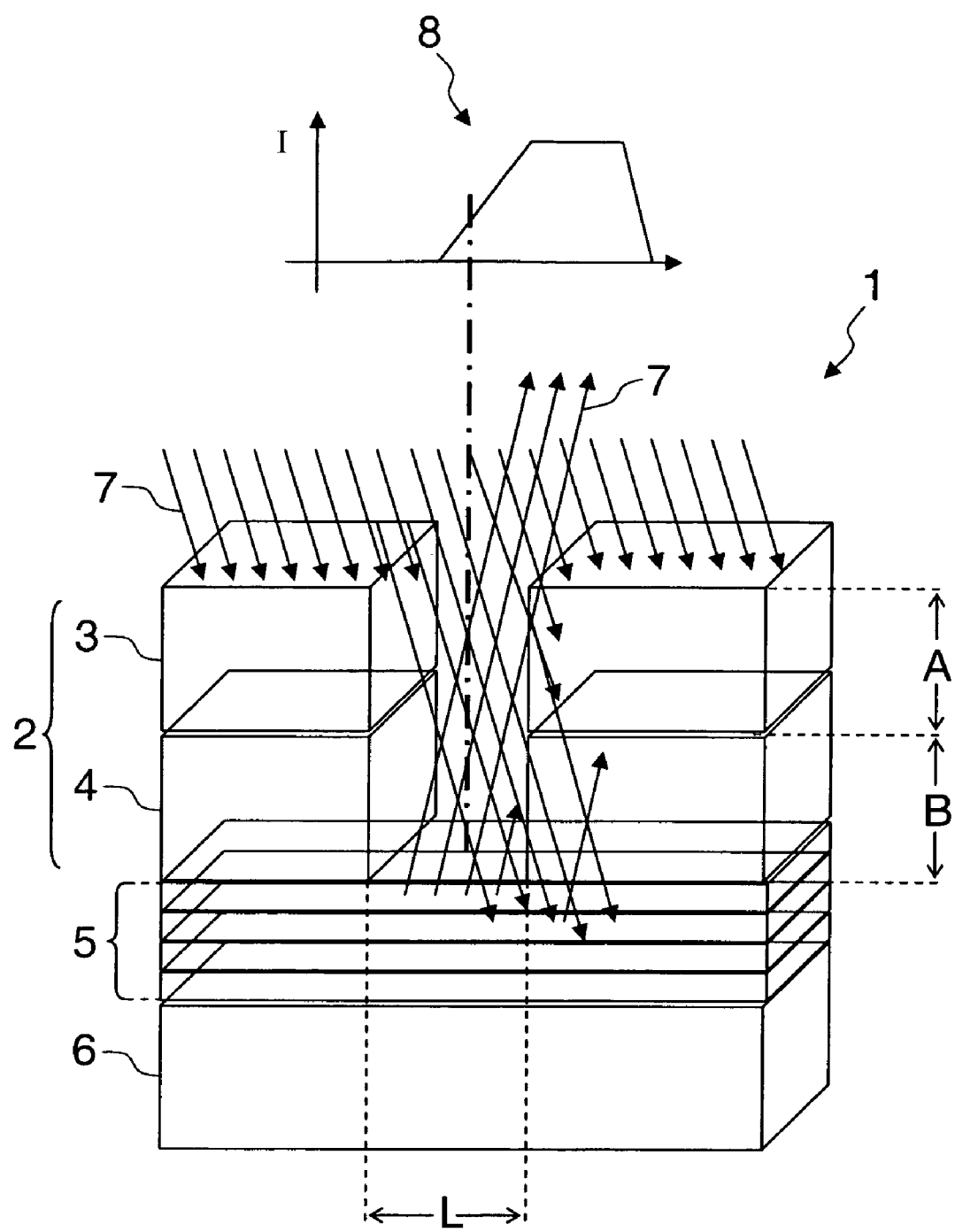
FIG. 1 shows a perspective view of a conventional lithographic reflection mask being irradiated at an oblique angle and a schematic intensity profile.

FIG. 1 shows a schematic view of a section of a conventional lithographic reflection mask 1 which is particularly used in a EUVL-process. For this, the reflection mask is integrated into an exposure tool (not shown) and irradiated at an oblique angle of e.g. 6° by a EUVL-radiation 7 having a wavelength of e.g. 13.4 nm.

The reflection mask 1 comprises a carrier substrate 6 and a multilayer reflection layer 5 provided on the carrier substrate 6. The reflection layer 5 comprises a number of reflective bilayers, e.g. Si/Mo-layers which are capable of reflecting the incident radiation 7.

In order to define a target pattern for a structure which is imaged on a substrate or wafer by means of the exposure tool including the lithographic reflection mask 1, the reflection mask 1 further comprises a patterned absorber stack 2 provided on the multilayer reflection layer 5. The absorber stack 2 comprises a patterned absorber layer 3 having an absorber layer thickness A and a patterned buffer layer 4 having a buffer layer thickness B.

The patterned absorber layer 3, which consists e.g. of Cr or TaN, serves for absorbing the radiation 7 in definite areas to define the structure imaged on a substrate. In order to provide a high absorption, the absorber layer 3 is generally fabricated with a relatively large thickness. The absorber layer 3 of the reflection mask 1 has a thickness A of e.g. 70 nm.

The buffer layer 4, which is located between the absorber layer 3 and the reflection layer 5, serves for protection of the reflection layer 5 during the fabrication process of the lithographic reflection mask 1 in particular concerning repair processes of structural defects of the absorber layer 3. The buffer layer 4 is generally structured like the absorber layer 3 and has a thickness B of e.g. 60 nm.

FIG. 1 also depicts a lateral dimension L of the absorber stack 2 which corresponds to the width of a recess located between two structural elements of the absorber stack 2. This lateral dimension L is considered to be converted into a critical dimension of the structure imaged on a substrate by means of the exposure tool including the lithographic reflection mask 1. The lateral dimension L can alternatively be defined as the width of a structural element of the absorber stack 2.

As can be seen from FIG. 1, the recess located between the structural elements of the absorber stack 2 is provided with vertical sidewalls. In other words, the sidewalls of the buffer layer 4 and of the absorber layer 3 have sidewall angles of 0° relative to a vertical plane.

The absorber stack 2 of the depicted conventional reflection mask 1 is characterized by a relatively large thickness compared to the wavelength of the radiation, which is given by the thicknesses A, B of the absorber layer 3 and the buffer layer 4. Moreover, the absorber stack 2 is characterized by a high aspect ratio, i.e. a high ratio between the thickness of the absorber stack 2 and the lateral dimension L. The large thickness and the high aspect ratio of the patterned absorber stack 2 of the lithographic reflection mask 1 involves some disadvantages.

The high aspect ratio of the absorber stack 2 in combination with the irradiation of the reflection mask 1 at an oblique angle results in shadowing effects of the patterned absorber stack 2, thus affecting the intensity profile of the reflected radiation 7. This impact of shadowing effects can be seen from the intensity profile 8 depicted in FIG. 1. In relation to the midpoint of the recess located between the structural elements of the absorber stack 2, which is illustrated by the dash-dotted line in FIG. 1, the maximum intensity is displaced. Moreover, the intensity profile 8 has an asymmetrical shape. In a lithographic process, such an intensity profile 8 provokes structure width alterations and structure displacements, thus decreasing the imaging quality.

Another consequence of the shadowing effects is a reduction of the lithography process window. The process window characterizes the possible variations of defocus and intensity dose values which correspond to a definite tolerable range of target critical dimension values of a structure imaged on a substrate by means of an exposure tool. These variations result e.g. from a wafer's non-flatness or fluctuations caused by the exposure tool during the lithographic process.

Figure 2:
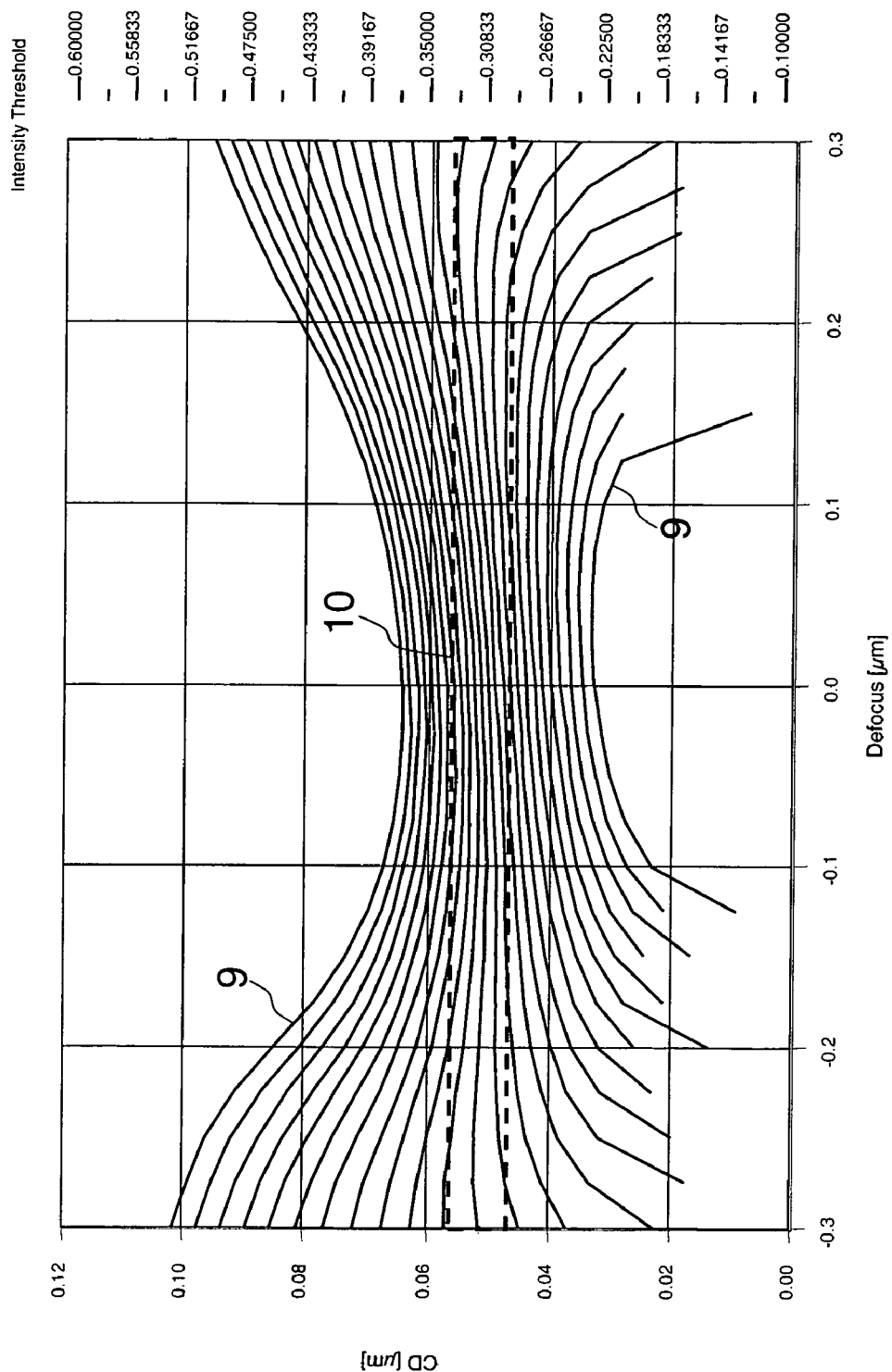
FIG. 2 shows Bossung plots obtained from the simulation of aerial images of radiation reflected on a conventional lithographic reflection mask.

A lithography process window and in particular its size can be evaluated with the aide of so-called Bossung plots. For this, FIG. 2 shows a number of Bossung plots 9 which are obtained from a simulation of aerial images. An aerial image is a normalized intensity distribution of a radiation imaged on a substrate by means of an exposure tool during a lithographic process.

In general, a number of aerial images are simulated for a range of defocus values. By applying a range of intensity threshold values, which correspond to the intensity dose variations of the exposure tool, critical dimensions of the structures imaged on a substrate can be derived. As a consequence, graphs representing the dependency between critical dimension and defocus values for constant intensity threshold values, also referred to as Bossung plots 9, can be obtained.

The Bossung plots 9 allow for determining a process window 10, as shown in FIG. 2. This process window 10 defines a tolerable range of critical dimension values and a range of defocus values. The corresponding tolerable intensity threshold values are consequently given by the Bossung plots 9 running within these value ranges.

The above-described shadowing effects of the absorber stack 2 of the conventional reflection mask 1 result in a tilting or bending of the parabolic Bossung plots 9. The tilted shape of the Bossung plots 9 has the effect that a few Bossung plots 9 run through the defined critical dimension and focus value ranges. In other words, the shadowing effects have the impact of a reduction of the process window 10.

Figure 3:
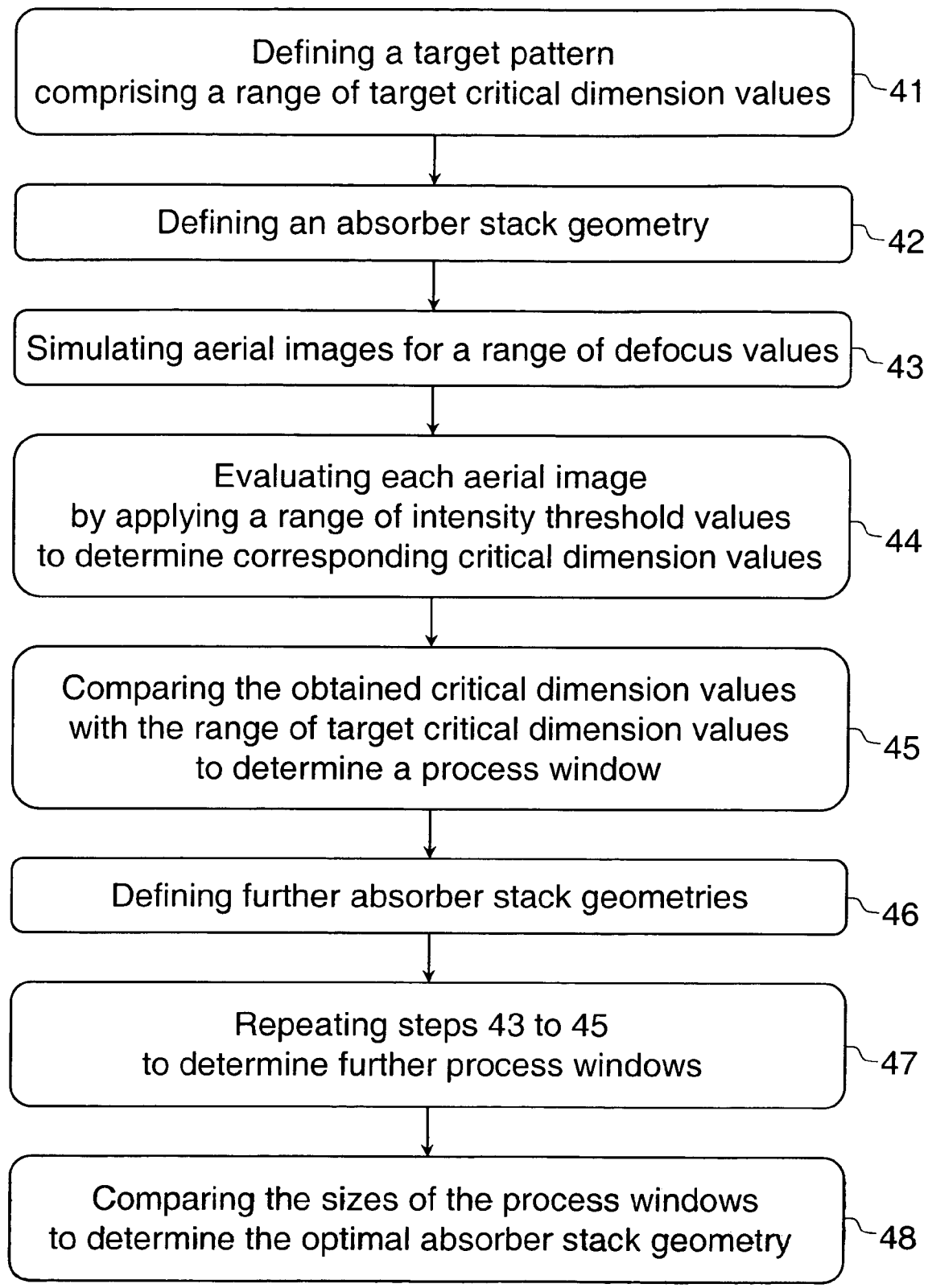
FIG. 3 shows a flow chart of a method according to the invention for determining an optimal absorber stack geometry of a lithographic reflection mask.

FIG. 3 shows a flow chart of a method according to the invention for determining an optimal absorber stack geometry of a lithographic reflection mask. Thereby, the lithographic reflection mask comprises a reflection layer and a patterned absorber stack provided on the reflection layer, wherein the absorber stack has a buffer layer and an absorber layer.

In a first step 41, a target pattern for a structure imaged on a substrate or wafer by means of an exposure tool including said lithographic reflection mask to reflect a radiation is defined. This target pattern, which includes e.g. a line and space structure or a contact hole structure, comprises a critical dimension range of target critical dimension values.

In a subsequent step 42, an absorber stack geometry for said target pattern is defined. This step 42 includes defining values of absorber stack parameters such as a buffer thickness, a buffer sidewall angle, an absorber thickness, an absorber sidewall angle and a lateral absorber stack dimension.

After that, aerial images of the structure imaged on the substrate are simulated for a range of predetermined defocus values (step 43). The simulation of aerial images is based on additional parameters such as optical material parameters of the absorber layer and the buffer layer like the absorption coefficient, and parameters characterizing the exposure tool such as the angle of incidence of the radiation, a numerical aperture, a partial coherence and a reduction factor.

In a subsequent step 44, each aerial image is evaluated by applying a predetermined range of intensity threshold values to determine corresponding critical dimension values of said structure imaged on said substrate. As mentioned above, these intensity threshold values correspond to intensity dose values of the exposure tool. This step 44 corresponds to an idealized resist system with infinite contrast.

Afterwards, the obtained critical dimension values of said structure imaged on the substrate are compared to the critical dimension range of target critical dimension values of said target pattern to determined process window (step 45), wherein the size of the process window is defined by defocus and intensity threshold values corresponding to target critical dimension values. This step 45 can e.g. be performed with the aide of the above-described Bossung plots.

Subsequently, further absorber stack geometries for the target pattern are defined by varying the values of one or more of said absorber stack parameters (step 46) and the steps 43 to 45 are repeated for the further absorber stack geometries to determine further process windows (step 47).

At the end, the sizes of the determined process windows corresponding to the defined absorber stack geometries are compared in a step 48 to determine the optimal absorber stack geometry. Thereby, the optimal absorber stack geometry is identified by the maximum process window size.

Concerning the absorber stack parameters, there are a number of different performing embodiments of the inventive method. One embodiment comprises e.g. using definite constant values for the buffer layer parameters and varying the values of the absorber layer parameters.

Figure 4:
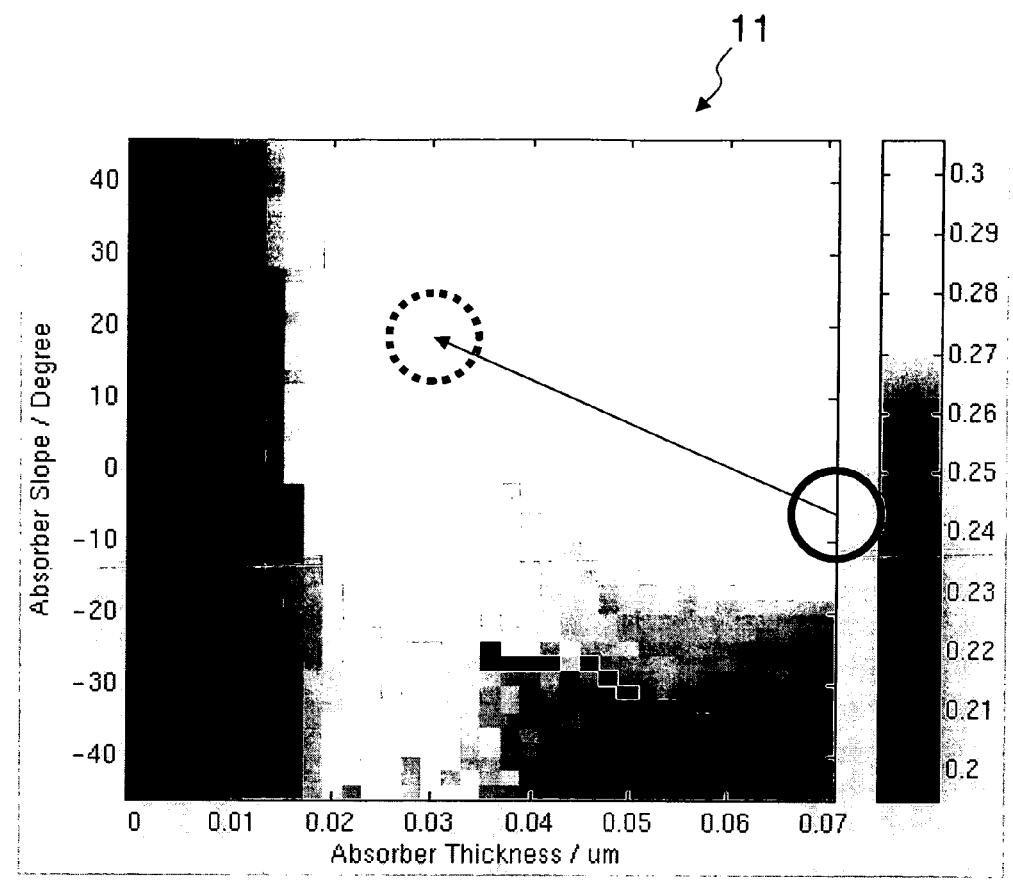
FIG. 4 shows a parameter space of simulated absorber stack geometries which is used to determine an optimal absorber stack geometry.

For this, FIG. 4 shows a parameter space 11 of simulated absorber stack geometries, which is used to determine an optimal absorber stack geometry. The parameter space 11 includes information on the process window size for different values of the absorber sidewall angle (absorber slope) and different values of the absorber thickness. The size of the process window is indicated by a brightness scale, which can be gathered from the bar located on the right-hand side. This bar assigns different process window sizes, which are specified in variable units, to different brightness graduations.

The process window sizes were determined by carrying out the inventive method depicted in FIG. 3. For this, the simulation of aerial images was based on a dense line and space structure as a target pattern having a critical dimension of 30 nm, an angle of incidence of the radiation of 6° relative to a vertical plane, a numerical aperture NA=0.3, a partial coherence Sigma=0.7 and a reduction factor of 5. For the buffer layer parameters, constant values, namely a thickness of 60 nm and a buffer sidewall angle of 0° relative to a vertical plane were used.

In the parameter space 11 from FIG. 4, the drawn through circle marks the absorber stack geometry of a conventional EUVL reflection mask, whereas the dotted circle marks the optimal absorber stack geometry providing a maximum process window size. The optimal absorber stack geometry is characterized by an absorber layer thickness of 30 nm and an absorber side wall angle of 20° relative to a vertical plane.

Figure 5:
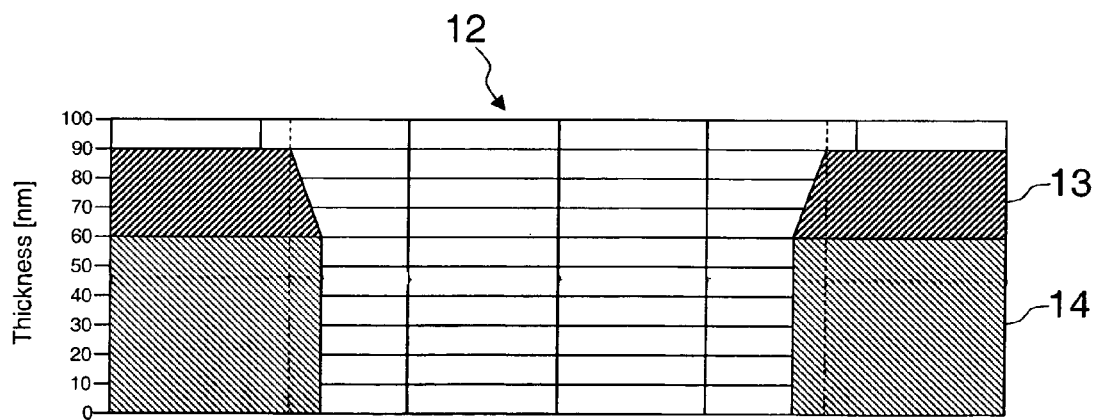
FIG. 5 shows a schematic view of an optimal absorber stack determined with the aide of the parameter space of FIG. 4.

A schematic view of an absorber stack 12 comprising an absorber layer 13 and a buffer layer 14 having an optimal geometry according to the parameter space 11 from FIG. 4 is depicted in FIG. 5. In comparison to a conventional EUVL reflection mask, a reflection mask having the absorber stack 12 provides an enhanced imaging stability due to the larger process window. Moreover, the thickness of the absorber stack 12, which is 90 nm, is reduced in comparison to the thickness of an absorber stack of a conventional reflection mask. The thickness of the absorber stack 2 of the reflection mask 1 from FIG. 1 is e.g. 130 nm. Consequently, shadowing effects are reduced, thus improving the imaging quality.

Figure 6:
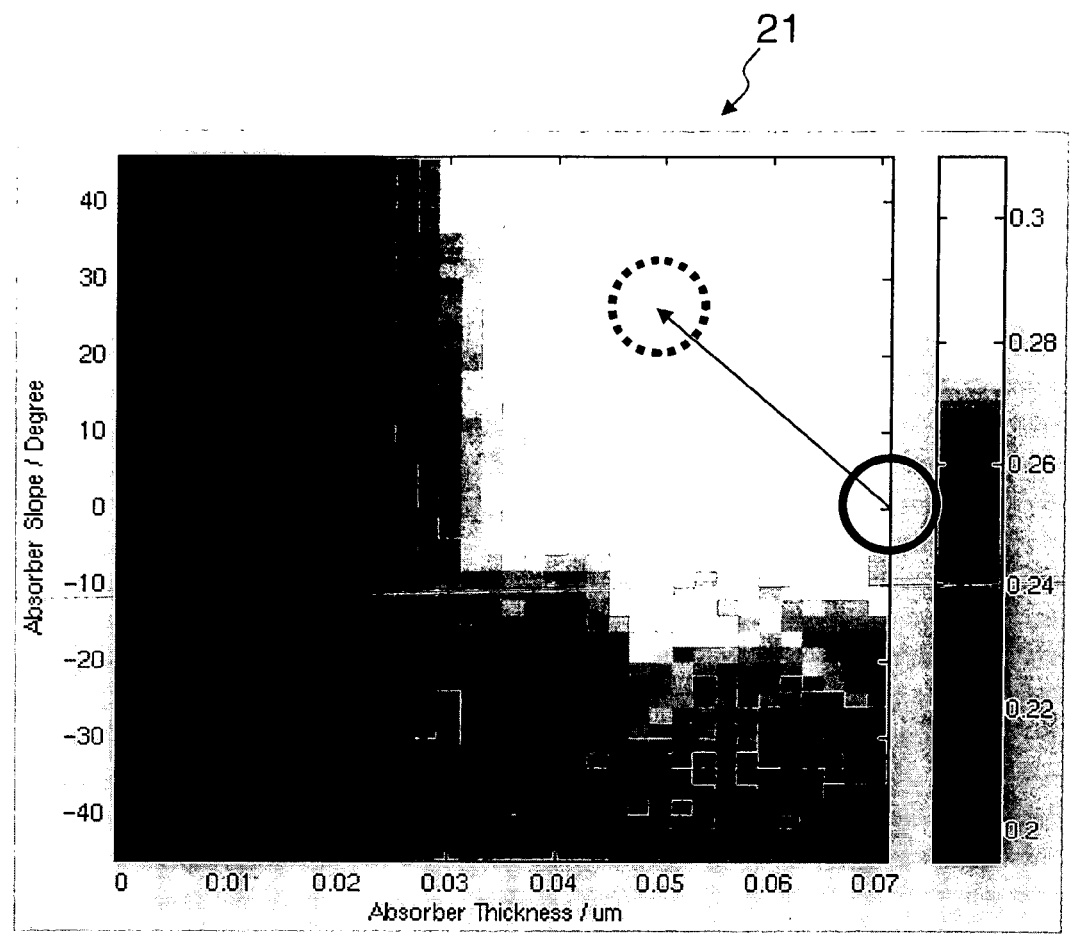
FIG. 6 shows another parameter space of a simulated absorber stack geometries.

FIG. 6 shows another parameter space 21 which was also compiled by carrying out the inventive method from FIG. 3.

Here, the simulation was also based on a line and space structure as target pattern having a critical dimension of 30 nm, an angle of incidence of the radiation of 6° relative to a vertical plane, a numerical aperture NA=0.3, a partial coherence Sigma=0.7 and a reduction factor of 5. Again, constant values for the buffer layer parameters were used, namely a thickness of 10 nm and a buffer sidewall angle of 0° relative to a vertical plane.

The drawn through circle in the parameter space 21 again marks the absorber stack geometry of a conventional EUVL reflection mask. The optimal absorber stack geometry marked by the dotted circle is characterized by a thickness of the absorber layer of 50 nm and an absorber sidewall angle of about 25° relative to a vertical plane.

Figure 7:
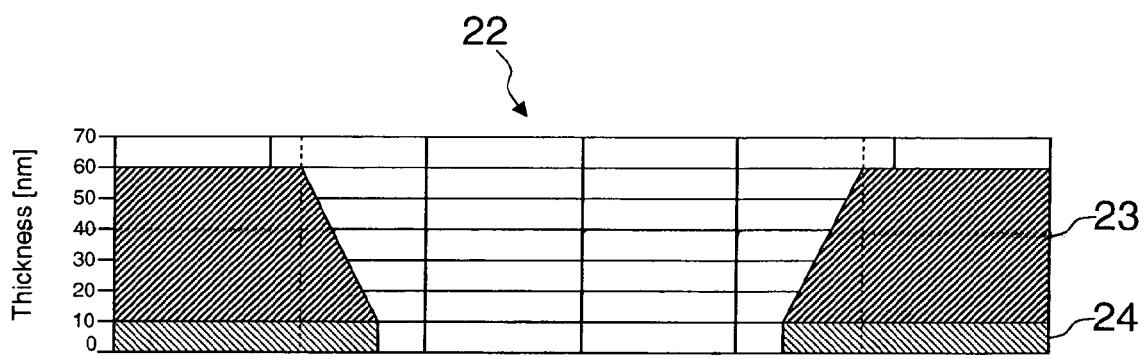
FIG. 7 shows a schematic view of an optimal absorber stack determined with the aide of the parameter space of FIG. 6.

FIG. 7 shows a schematic view of an absorber stack 22 comprising an absorber layer 23 and a buffer layer 24 having an optimal geometry according to the parameter space 21 from FIG. 6. A reflection mask having such an absorber stack 22 again provides a large process window and an improved imaging quality due to a reduced thickness of the stack 22, which is only 60 nm at hand.

These two simulation examples described with reference to FIGS. 4, 5, 6 and 7 do not limit the scope of the inventive method, however. Regarding the variations of the absorber stack parameters, alternative performing embodiments of the inventive method exist.

As an example, it is possible to use constant absorber layer and buffer layer sidewall angles, e.g. 0° relative to a vertical plane, and to vary the values of the thicknesses of the absorber layer and of the buffer layer to determine an optimal absorber stack geometry providing a process window with a maximum size. Additionally, the thus determined values of the thicknesses can e.g. be kept constant and the values of the absorber layer and buffer layer sidewall angles are varied afterwards to determine a further optimised absorber stack geometry providing a process window having a still larger size.

In a further alternative embodiment, the value of the buffer layer thickness is kept constant and the values of the absorber layer thickness and of the absorber layer and buffer layer sidewall angles are varied. Moreover other alternative embodiments are imaginable.

In this context, it is also possible to use a lateral absorber stack dimension as a varying parameter. A value of this parameter can be defined and e.g. be kept constant in the first instance to determine an optimal absorber stack geometry providing a maximum process window. Afterwards, the value of the lateral absorber stack dimension is varied to determine a further optimised absorber stack geometry providing a process window having a still larger size. It is also possible to vary the value of the lateral absorber stack dimension at first and to keep it constant towards the end or to vary its value during, the whole simulation performance.

Moreover, it is possible to define a range of values of the absorber stack parameters used in the simulation steps in advance on the basis of intensity contrast values of simulated aerial images. The intensity contrast of an aerial image is the difference between the maximum and the minimum intensity values. In this context, it is preferred to define values of absorber stack parameters which provide a relatively high intensity contrast. With such a predefined range of absorber stack parameters used in the simulation steps, the inventive method depicted in FIG. 3 can be sped up. Particularly, it is additionally preferred to predetermine low values of the thicknesses of the buffer layer and/or the absorber layer. In this manner, the resulting optimal absorber stack has a low thickness in addition, thereby reducing shadowing effects.

Alternatively, it is possible to predefine a range of values of the absorber stack parameters used in the simulation steps on the basis of intensity contrast values of simulated near-fields. A near-field is the intensity distribution of the radiation reflected on the reflection mask, thus neglecting the optical characteristics of an exposure tool. Consequently, the above-mentioned predetermination of values of absorber stack parameters can be sped up and can be carried out independently from the properties of an exposure tool. Accordingly, it is preferred to predefine values of absorber stack parameters providing relatively high intensity contrasts, and in particular low values of the buffer layer and absorber layer thicknesses.

Moreover further embodiments of the inventive method for determining an optimal absorber stack geometry are imaginable, which represent variations or combinations of the above-described embodiments.

The inventive method depicted in FIG. 3 can also be expanded with a so-called resist model which accounts for the exposing and developing performance of a photoresist layer provided on the irradiated substrate or wafer. With the aide of a resist model, an interaction of aerial images with the photoresist layer and a subsequent developing process of the photoresist layer, and so the photoresist image or profile of the target pattern on the surface of the substrate or wafer can be simulated. For such an expanded simulation method, additional parameters accounting for photoresist properties are included in the simulation. In addition, the size of the process window has to be defined in another manner, e.g. defocus and intensity dose values corresponding to a range of critical dimensions of the photoresist profile.

Figure 8:
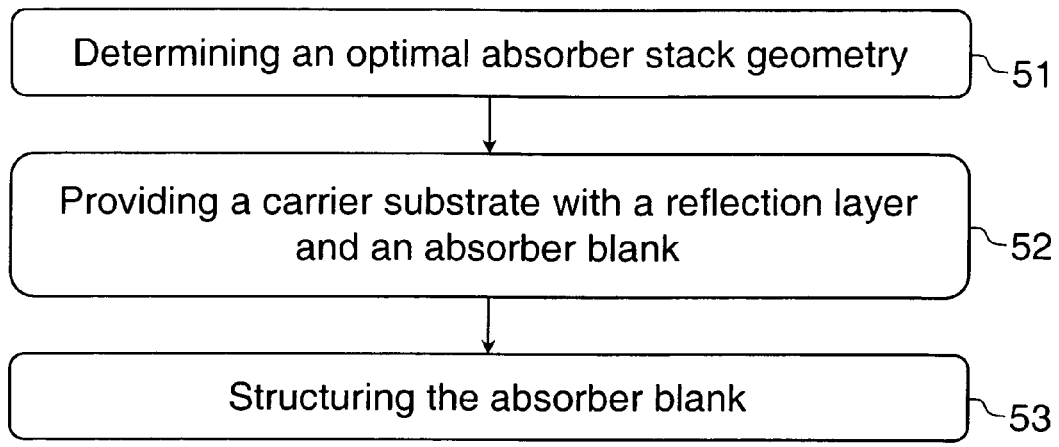
FIG. 8 shows a flow-chart of a method according to the invention for fabricating a lithographic reflection mask.

FIG. 8 shows a flow chart of a method according to the invention for fabricating a lithographic reflection mask comprising a reflection layer and a patterned absorber stack provided on the reflection layer, wherein the absorber stack has a buffer layer and an absorber layer. In a first step 51, an optimal absorber stack geometry of the reflection mask is determined by performing one of the above-described embodiments of the simulation method.

In a subsequent step 52, a carrier substrate with a reflection layer and an absorber blank provided on the reflection layer is provided. The absorber blank has an unpatterned buffer layer and an unpatterned absorber layer, wherein the thicknesses of the buffer layer and of the absorber layer are defined according to the determined optimal absorber stack geometry.

In a further step 53, the absorber blank is structured according to the target pattern used in the simulation method to provide a patterned absorber stack on the reflection layer. Thereby, sidewalls of the buffer layer and of the absorber layer are provided with sidewall angles according to the determined optimal absorber stack geometry. If necessary, also a lateral absorber stack dimension is provided according to the determined optimal stack geometry.

This method makes it possible to fabricate a lithographic reflection mask having an optimal absorber stack, which provides an enhanced imaging quality in a lithographic process. The fabrication method particularly allows for fabricating a reflection mask having an absorber stack with a reduced thickness and consequently reduced shadowing effects. Regarding the reduced thickness of the absorber stack, the structuring step 53 is also facilitated. Moreover, the method is suited for fabricating reflection masks having optimal absorber stacks, wherein the buffer and absorber layers particularly feature sidewalls having sidewall angles of more than zero degrees relative to a vertical plane.

Figure 9:
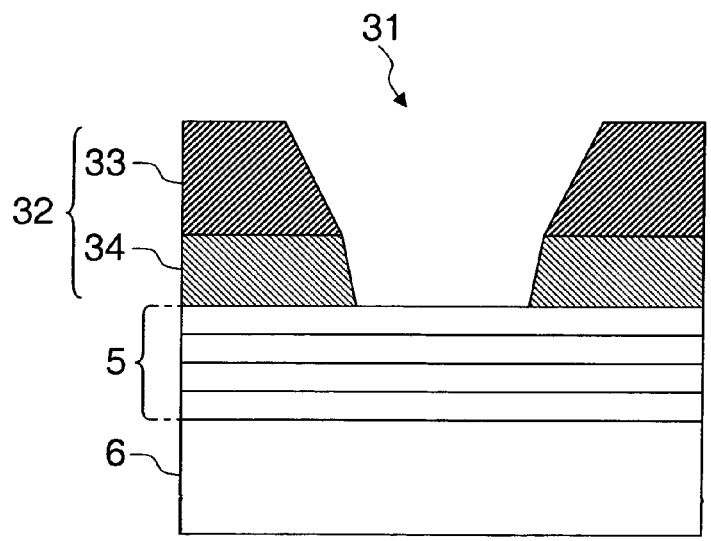
FIG. 9 shows a schematic view of a lithographic reflection mask according to a preferred embodiment of the present invention.

For this, FIG. 9 shows a schematic view of a lithographic (EUVL) reflection mask 31 according to a preferred embodiment of the present invention. This reflection mask 31 can favorably be fabricated according to the fabrication method depicted in FIG. 8. The reflection mask 31 comprises a carrier substrate 6 and a multilayer reflection layer 5 provided on said carrier substrate 6. The reflection mask 31 further comprises an absorber stack 32 provided on the reflection layer 5. The absorber stack 32 comprises a buffer layer 34 and an absorber layer 33, and preferably has a thickness which is reduced in comparison to the thickness of an absorber stack of a conventional EUVL reflection mask.

The absorber layer 33 features sidewalls having a sidewall angle of at least 20° relative to a vertical plane. The buffer layer features sidewalls having a sidewall angle of more than 0° relative to a vertical plane. As a consequence, shadowing effects are widely reduced when exposing the reflection mask 31 to a radiation. In order to further reduce shadowing effects, the absorber layer 33 preferably features sidewalls having a sidewall angle of at least 30° to a vertical plane.

In contrast to the reflection mask 31 shown in FIG. 9, reflection masks with absorber stacks having alternative geometries are imaginable. It is for example possible to provide an absorber stack wherein the absorber layer and the buffer layer comprise sidewalls having equal sidewall angles of preferably more than 0° to a vertical plane.

What is claimed is:

1. A method for determining an optimal absorber stack geometry of a lithographic reflection mask comprising a reflection layer and a patterned absorber stack provided on the reflection layer, the absorber stack having a buffer layer and an absorber layer, comprising:
    a) defining a target pattern for a structure imaged on a substrate by an exposure tool including the lithographic reflection mask to reflect a radiation, the target pattern comprising a critical dimension range of target critical dimension values;
    b) defining an absorber stack geometry for the target pattern including defining a value of at least one absorber stack parameter, the absorber stack parameter includes a buffer thickness, a buffer sidewall angle, an absorber thickness, an absorber sidewall angle and a lateral absorber stack dimension;
    c) simulating aerial images of the structure imaged on the substrate for a predetermined range of defocus values;
    d) evaluating each aerial image by applying a predetermined range of intensity threshold values to determine corresponding critical dimension values of the structure imaged on the substrate;
    e) comparing the obtained critical dimension values of the structure imaged on the substrate with the critical dimension range of target critical dimension values of the target pattern to determine a process window, wherein the size of the process window is defined by defocus and intensity threshold values corresponding to target critical dimension values;
    f) defining further absorber stack geometries for the target pattern by varying the value of the absorber stack parameter;
    g) repeating steps c) to e) for the further absorber stack geometries to determine further process windows; and
    h) comparing the sizes of the determined process windows corresponding to the defined absorber stack geometries to determine the optimal absorber stack geometry, wherein the optimal absorber stack geometry is identified by the maximum process window size.

2. The method according to claim 1, wherein a range of values of the absorber stack parameter used in the simulation steps is defined on the basis of intensity contrast values of simulated aerial images.

3. The method according to claim 1, wherein a range of values of the absorber stack parameter used in the simulation steps is defined on the basis of intensity contrast values of simulated near-fields of the radiation reflected on the lithographic reflection mask.

4. A method for fabricating a lithographic reflection mask comprising a reflection layer and a patterned absorber stack provided on the reflection layer, the absorber stack having a buffer layer and an absorber layer, comprising:
    determining an optimal absorber stack geometry of the lithographic reflection;
    providing a carrier substrate with a reflection layer and an absorber blank provided on the reflection layer, the absorber blank having an unpatterned buffer layer and an unpatterned absorber layer, wherein the thicknesses of the buffer layer and of the absorber layer are defined according to the determined optimal absorber stack geometry; and
    structuring the absorber blank according to the target pattern to provide a patterned absorber stack on the reflection layer, wherein sidewalls of the buffer layer and of the absorber layer are provided with sidewall angles according to the determined optimal absorber stack geometry.

5. A lithographic reflection mask, comprising:
    a carrier substrate;
    a reflection layer provided on the carrier substrate; and
    a patterned absorber stack provided on the reflection layer comprising a buffer layer and an absorber layer, wherein sidewalls of the absorber layer have a sidewall angle of at least ten degrees relative to a vertical plane.

6. The lithographic reflection mask according to claim 5, wherein sidewalls of the absorber layer have a sidewall angle of at least twenty degrees relative to a vertical plane.

7. The lithographic reflection mask according to claim 5, wherein sidewalls of the buffer layer have a sidewall angle of more than zero degrees relative to a vertical plane.

* * * * *